(12) United States Patent
Hikita et al.

(10) Patent No.: US 6,797,996 B1
(45) Date of Patent: Sep. 28, 2004

(54) COMPOUND SEMICONDUCTOR DEVICE AND METHOD FOR FABRICATING THE SAME

(75) Inventors: Masahiro Hikita, Toyama (JP); Manabu Yanagihara, Osaka (JP); Tuyoshi Tanaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/445,035

(22) Filed: May 27, 2003

(51) Int. Cl.[7] .............................................. H01L 29/737
(52) U.S. Cl. ...................................... 257/197; 257/198
(58) Field of Search ................................. 257/197–198

(56) References Cited

U.S. PATENT DOCUMENTS

| | | | | |
|---|---|---|---|---|
| 4,686,550 A | * | 8/1987 | Capasso et al. ............... | 257/12 |
| 4,772,934 A | | 9/1988 | Cunningham et al. | |
| 6,031,256 A | * | 2/2000 | Liu et al. ..................... | 257/198 |
| 6,399,969 B1 | * | 6/2002 | Twynam ..................... | 257/191 |
| 6,459,103 B1 | * | 10/2002 | Liu et al. ..................... | 257/197 |
| 6,563,145 B1 | * | 5/2003 | Chang et al. ............... | 257/197 |
| 6,737,684 B1 | * | 5/2004 | Takagi et al. ............... | 257/194 |

OTHER PUBLICATIONS

Liu et al., A New InGaP/GaAs Double Heterojunction Bipolar Transistor (DHBT) with a L–Doped Wide–Gap Collector, Optoelectronic and Microelectronic Materials Devices, 1998. Proceedings. 1998 Conference on, Dec. 14–16, 1998, pp. 243–245.*

Liu et al., "A new InGaP–GaAs double delta–doped heterojunction bipolar transistor (D3HBT)," Microwave and Millimeter Wave Technology Proceedings, 1998. ICMMT '98. 1998 International Conference on, Aug. 18–20, 1998, pp. 100–103.*

Lour et al., "Investigation of InGaP/GaAs single and double heterojunction bipolar transistors by doping spike," Optoelectronic and Microelectronic Materials And Devices Proceedings, 1996 Conference on, Dec. 8–11, 1996, pp. 271–274.*

* cited by examiner

Primary Examiner—Bradley Baumeister
(74) Attorney, Agent, or Firm—McDermott Will & Emery LLP

(57) ABSTRACT

A compound semiconductor device includes an emitter layer, a base layer which is in contact with the emitter layer and formed of a first compound semiconductor, a collector layer which is in contact with the base layer and formed of a second compound semiconductor having a wider bandgap than that of the first compound semiconductor. In the device, a delta doped layer having a higher concentration of an impurity than that of the collector layer is formed at the heterojunction interface between the collector layer and the base layer or in a region of the collector layer located at about 10 nm or less from the heterojunction interface with the base layer.

3 Claims, 2 Drawing Sheets

COMPOUND SEMICONDUCTOR DEVICE AND METHOD FOR FABRICATING THE SAME

BACKGROUND OF THE INVENTION

The present invention relates to compound semiconductor devices, and more particularly relates to high-speed operating heterojunction bipolar transistors.

In heterojunction bipolar transistors (which will be herein referred to as "HBTs"), emitter injection efficiency (i.e., the ratio of electric current injected into a base layer to the entire emitter current) is increased by using, for an emitter layer, a semiconductor material having a wider bandgap than that of a material for a base layer. In other words, a heterojunction formed between the emitter layer and the base layer is utilized to increase the emitter injection efficiency. Thus, the thickness of the base can be reduced and thereby the impurity concentration in the base layer can be increased. Therefore, HBTs can operate at a high speed.

Moreover, HBTs utilizing the heterojunction between a base layer and a collector layer as well as the heterojunction between an emitter layer and the base layer are called "double heterojunction bipolar transistors" (which will be herein referred to as "DHBTs"). In DHBTs, compared to HBTs including a homojunction interface between a base layer and a collector layer, collector breakdown voltage is increased while collector-emitter offset voltage is reduced. Thus, operation properties of DHBTs can be advantageously improved with a low voltage applied.

In DHBTs, however, a semiconductor material having a wider bandgap than that of a material for a base layer is used as a material for a collector layer, and therefore an energy barrier is formed in the conduction band of the heterojunction interface between a collector layer and the base layer. The energy barrier blocks electrons' movement, resulting in the electron blocking effect of lowering current gain and degrading transistor properties. Then, as a conventional technique for preventing the electron blocking effect, a method in which the height of an energy barrier formed at a heterojunction interface is reduced by providing a setback layer interposed between a base layer and a collector layer is well known.

Note that a heterojunction interface means herein the interface between a semiconductor layer having a relatively narrow bandgap and a semiconductor layer having a relatively wide bandgap. Therefore, in a DHBT in which no setback layer is provided, the interface between a base layer and a collector layer is a heterojunction interface. On the other hand, in a DHBT in which a setback layer, e.g., formed of the same material as that of the base layer, is provided, the interface between the setback layer and a collector layer is a heterojunction interface.

FIG. 3 is a cross-sectional view of a conventional compound semiconductor device. More specifically, FIG. 3 is a cross-sectional view of a DHBT including a setback layer.

As shown in FIG. 3, a buffer layer 11 formed of a GaAs layer, a sub-collector layer 12 formed of an n-type GaAs layer, a collector layer 13 formed of an n-type InGaP layer, a setback layer 14 formed of an undoped GaAs layer, a base layer 15 formed of a p-type GaAs layer, an emitter layer 16 formed of an n-type InGaP layer, a contact layer 17 formed of an n-type GaAs layer, and an emitter cap layer 18 formed of an n-type InGaAs layer are stacked in this order on a semiconductor substrate 10 formed of a GaAs substrate which is a semi-insulator. In this case, GaAs having a narrower bandgap than that of a material for the collector layer 13 (InGaP) is used as a material for the setback layer 14. That is to say, the setback layer 14 is formed of the same material as that of the base layer 15. Moreover, a collector electrode 19 is formed on a region of the sub-collector layer 12 on which the collector layer 13 does not exist. A base electrode 20 is formed on a region of the base layer 15 on which the emitter layer 16 does not exist. And an emitter electrode 21 is formed on the emitter cap layer 18.

FIG. 4 is a diagram illustrating energy bandgaps in the FHBT shown in FIG. 3.

As shown in FIG. 4, each of the energy bandgaps of the emitter layer 16 and the collector layer 13 is wider than that of the base layer 15. It can be also seen from FIG. 4 that with the setback layer 14 provided between the base layer 15 and the collector layer 13, the height of the energy barrier formed at the heterojunction junction is reduced, and thus electrons can easily move from the base layer 15 to the collector layer 13.

However, the DHBT of FIG. 3, i.e., a conventional compound semiconductor device, still has a problem in which, although the height of the energy barrier seen from electrons can be reduced to a certain level by providing the setback layer 14, the electron blocking effect can not be completely prevented.

SUMMARY OF THE INVENTION

In view of the above-described problems, an object of the present invention is to ensure prevention of the electron blocking effect in a double heterojunction bipolar transistor.

To attain the above-described object, a first compound semiconductor device according to the present invention is assumed to include: an emitter layer; a base layer which is in contact with the emitter layer and formed of a first compound semiconductor; and a collector layer which is in contact with the base layer and formed of a second compound semiconductor having a wider bandgap than that of the first compound semiconductor. In the device, a delta doped layer having a higher concentration of an impurity than that of the collector layer is formed in a region of the collector layer located at about 10 nm or less from the heterojunction interface with the base layer.

In the first compound semiconductor device, the delta doped layer is provided in a region of the collector layer located in the vicinity of the heterojunction interface with the base layer. Thus, the thickness of an energy barrier formed at the heterojunction interface is reduced and electrons can easily pass through the energy barrier. Therefore, it is possible to suppress the energy barrier's blocking of movement of electrons injected from the base layer to the collector layer, and thus the electron blocking effect can be reliably prevented. Accordingly, current gain is increased and thus transistor properties can be improved, resulting in, e.g., a highly effective double heterojunction bipolar transistor suitable for high-speed operation.

To attain the above-described object, a second compound semiconductor device according to the present invention is assumed to include: an emitter layer; a base layer which is in contact with the emitter layer and formed of a first compound semiconductor; a collector layer which is in contact with the base layer and formed of a second compound semiconductor having a wider bandgap than that of the first compound semiconductor. In the device, a delta doped layer having a higher concentration of an impurity than that of the collector layer is formed at the heterojunction interface between the collector layer and the base layer.

In the second compound semiconductor, the delta doped layer is provided at the heterojunction interface between the collector layer and the base layer. Thus, the height of an energy barrier formed at the heterojunction interface is reduced and electrons can easily go over the energy barrier.

Therefore, it is possible to suppress the energy barrier's blocking of movement of electrons injected from the base layer into the collector layer, and thus the electron blocking effect can be reliably prevented. Accordingly, current gain is increased and thus transistor properties can be improved, resulting in, e.g., a highly effective double heterojunction bipolar transistor suitable for high-speed operation.

A third compound semiconductor device according to the present invention is assumed to include: an emitter layer; a base layer which is in contact with the emitter layer and formed of a first compound semiconductor; and a collector layer which is in contact with the base layer and formed of a second compound semiconductor having a wider bandgap than that of the first compound semiconductor. The device further includes a setback layer provided between the collector layer and the base layer and formed of a third compound semiconductor having a narrower bandgap than that of the second compound semiconductor. And in the device, a delta doped layer having a higher concentration of an impurity than that of the collector layer is formed in a region of the collector layer located at about 10 nm or less from the heterojunction interface with the setback layer.

In the third compound semiconductor device, the setback layer is provided between the collector layer and the base layer and the delta doped layer is provided in a region of the collector layer located in the vicinity of the heterojunction interface with the setback layer. Thus, the height and thickness of an energy barrier formed at the heterojunction interface are reduced and electrons can easily go over or through the energy barrier. Therefore, it is possible to suppress the energy barrier's blocking of the movement of electrons injected from the base layer into the collect layer, and thus the electron blocking effect can be reliably prevented. Accordingly, current gain is increased and thus transistor properties can be improved, resulting in, e.g., a highly effective double heterojunction bipolar transistor suitable for high-speed operation.

A fourth compound according to the present invention is assumed to includes: an emitter layer; a base layer which is in contact with the emitter layer and formed of a first compound semiconductor; and a collector layer which is in contact with the base layer and formed of a second compound semiconductor having a wider bandgap than that of the first compound semiconductor. The device further includes a setback layer provided between the collector layer and the base layer and formed of a third compound semiconductor having a narrower bandgap than that of the second compound semiconductor. And in the device, a delta doped layer having a higher concentration of an impurity than that of the collector layer is formed at the heterojunction interface between the collector layer and the setback layer.

In the fourth compound semiconductor device, the setback layer is provided between the collector layer and the base layer and the delta doped layer is provided at the heterojunction interface between the collector layer and the setback layer. Thus, compared to the case in which only the setback layer is provided, the height of an energy barrier formed at the heterojunction interface is further reduced and electrons can easily go over the energy barrier. Therefore, it is possible to suppress the energy barrier's blocking of movement of electrons injected from the base layer into the collect layer, and thus the electron blocking effect can be reliably prevented. Accordingly, current gain is increased and thus transistor properties can be improved, resulting in, e.g., a highly effective double heterojunction bipolar transistor suitable for high-speed operation.

In the first through fourth compound semiconductor devices, the collector layer preferably includes a semiconductor layer formed of InGaP, InP or GaAs.

Thus, a double heterojunction bipolar transistor can be reliably achieved.

A method for fabricating a compound semiconductor device according to the present invention, which is assumed to be a method for fabricating either one of the first through fourth compound semiconductor devices, includes the step of forming the delta doped layer, while epitaxially growing a semiconductor layer that is to be the collector layer, by stopping the epitaxial growth and then introducing into the semiconductor layer an amount of impurity at least required to form a single atomic layer.

With the method for fabricating a compound semiconductor device according to the present invention, the capacitance between the base layer and the collector layer can be reduced, compared to the case in which the electron blocking effect is prevented by continuously changing the impurity concentration of the collector layer. Moreover, the amount of an impurity to be added as a delta doped layer into the collector layer can be accurately controlled with high reproducibility and without depending on epitaxial growth conditions, thus achieving stable transistor properties.

DESCRIPTION OF THE PREFERRED EMBODIMENTS

Hereinafter, a compound semiconductor device and a method for fabricating the same according to one of embodiments of the present invention will be described with reference to the accompanying drawings.

Figure 1:
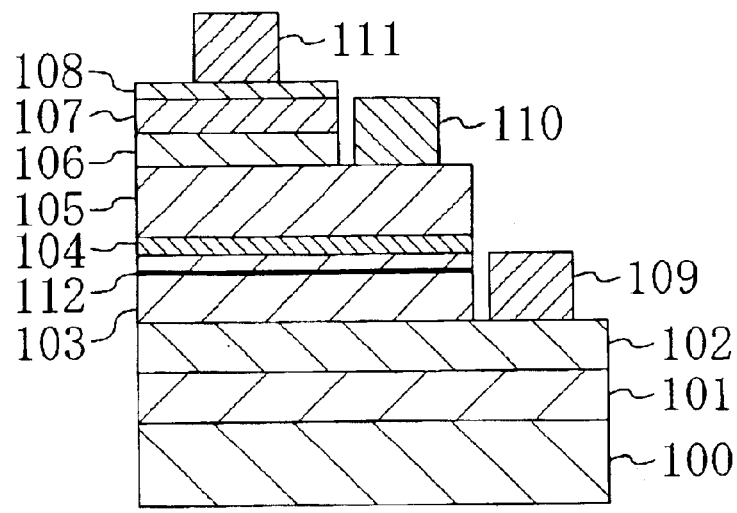
FIG. 1 is a cross-sectional view of a compound semiconductor device according to one of embodiments of the present invention.

FIG. 1 is a cross-sectional view of a compound semiconductor device according to this embodiment. More specifically, FIG. 1 is a cross-sectional view of a DHBT type compound semiconductor device.

As shown in FIG. 1, a buffer layer 101 formed of, e.g., a GaAs layer with a thickness of 250 nm; a sub-collector layer 102 formed of, e.g., an n-type (impurity concentration: $2 \times 10^{18}$ cm$^{-3}$) GaAs layer with a thickness of 250 nm; a collector layer 103 formed of, e.g., an n-type (impurity concentration: $1 \times 10^{17}$ cm$^{-3}$) InGaP layer with a thickness of 400 nm; a setback layer 104 formed of, e.g., an undoped GaAs layer with a thickness of 20 nm; a base layer 105 formed of, e.g., a p-type (impurity concentration: $1.2 \times 10^{19}$ cm$^{-3}$) GaAs layer with a thickness of 850 nm; an emitter layer 106 formed of, e.g., an n-type (impurity concentration: $1 \times 10^{17}$ cm$^{-3}$) InGaP layer with a thickness of 250 nm; a contact layer 107 formed of, e.g., an n-type (impurity concentration: $2 \times 10^{18}$ cm$^{-3}$) GaAs layer with a thickness of 250 nm; and an emitter cap layer 108 formed of, e.g., an n-type (impurity concentration: $2 \times 10^{18}$ cm$^{-3}$) InGaAs layer with a thickness of 5 nm are stacked in this order on a semiconductor substrate 100 formed of, e.g., a GaAs substrate which is a semi-insulator. In this case, GaAs having a narrower bandgap than that of a material (InGaP) for the collector layer 103 is used as a material for the setback layer 104. That is to say, the setback layer 104 is formed of the same material as that of the base layer 105. Moreover, a collector electrode 109 is formed on a region of the sub-collector layer 102 on which the collector layer 103 does not exit. A base electrode 110 is formed on a region of the base layer 105 on which the emitter layer 106 does not exist. And an emitter electrode 111 is formed on the emitter cap layer 108.

This embodiment is characterized in that a very thin delta doped layer 112 which has a higher (n-type) impurity concentration than that of the collector layer 103 is provided in a region of the collector layer 103 located at about 5 nm from the heterojunction interface with the setback layer 104. In this case, the delta doped layer 112 can be formed, while epitaxially growing an InGaP layer that is to be the collector layer 103, by stopping the epitaxial growth and then introducing into the InGaP layer an impurity, e.g., Si at about an amount required to form a single atomic layer. More specifically, when an InGaP layer that is to be the collector layer 103 is formed by MOCVD (metal organic chemical vapor deposition), TMI (trimethylindium) and TMG (trimethylgallium) as source gases of Group III elements, and $PH_3$ (phosphine) as a source gas of a Group V element are introduced into the heated substrate. Then, during the epitaxial growth of the InGaP layer, the introduction of the source gases of Group III elements is stopped and the source gas of a Group V element and $Si_2H_6$ (disilane) as a source gas of an impurity element are introduced into the substrate, such that only Si is deposited on the substrate. Thereafter, the source gases of Group III elements are again introduced to restart epitaxial growth of the InGaP layer. Note that Si atoms introduced into the InGaP layer at about an amount required to form a single atomic layer are to be diffused therein during the subsequent process steps and thus the delta doped layer 112 is thicker than a single atomic layer at the end.

Figure 2:
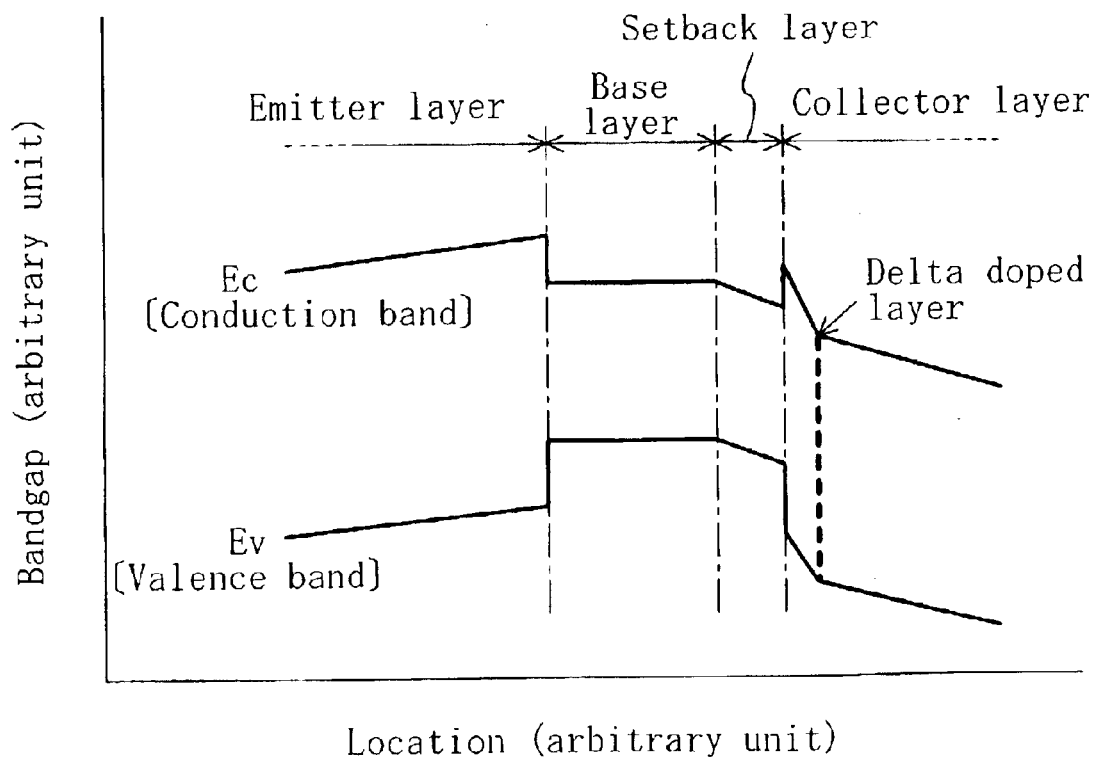
FIG. 2 is a diagram illustrating energy bands in the compound semiconductor according to the embodiment of the present invention.
Figure 3:
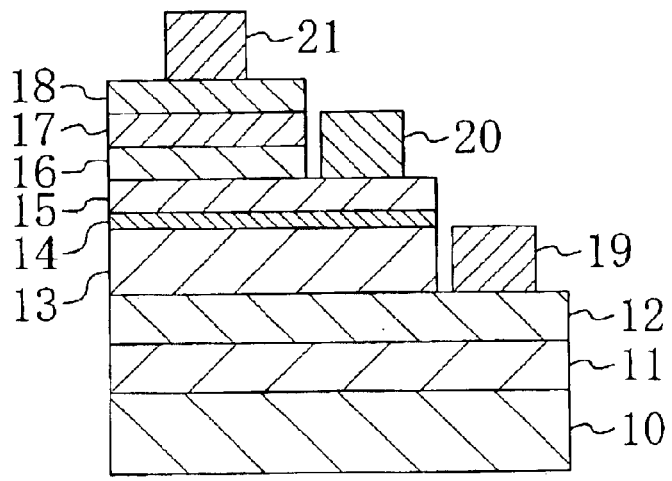
FIG. 3 is a cross-sectional view of a conventional compound semiconductor device.
Figure 4:
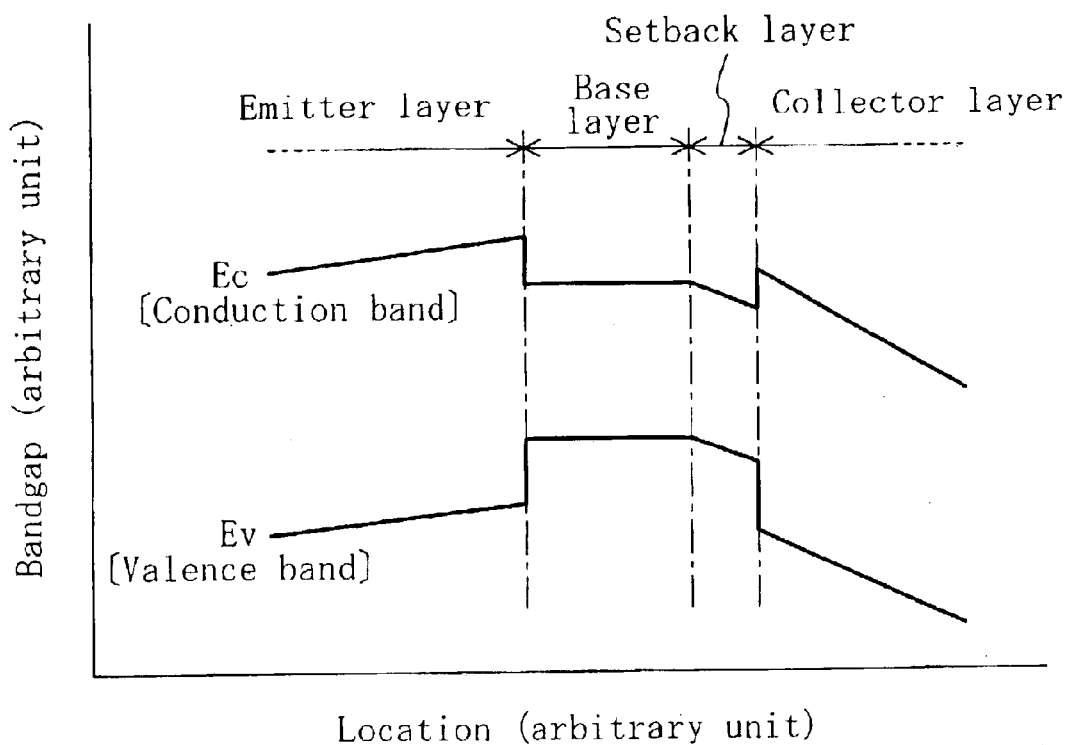
FIG. 4 is a diagram illustrating energy bands in the conventional compound semiconductor device.

FIG. 2 is a diagram illustrating energy bands in the DHBT of FIG. 1.

As shown in FIG. 2, the respective bandgaps of the emitter layer 106 and the collector layer 103 are wider than that of the base layer 105. Moreover, with the delta doped layer 112, the energy level of the conduction band in the collector layer 103 is reduced, and thus the thickness of an energy barrier formed at the heterojunction interface between the setback layer 104 and the collector layer 103 is reduced. Therefore, electrons can easily move from the base layer 105 to the collector layer 103. Furthermore, as a result of providing the setback layer 104 between the base layer 105 and the collector layer 103, the height of the energy barrier formed at the heterojunction interface is reduced and thus electrons can move more easily from the base layer 105 to the collector layer 103.

As has been described, in this embodiment, the delta doped layer 112 is provided in a region of the collector layer 103 located in the vicinity of the heterojunction interface with the base layer 105. Thus, the thickness of an energy barrier formed at the heterojunction interface is reduced. As a result, when electrons from the emitter layer 106 are injected into the collector layer 103 via the base layer 105, the electrons can easily pass through the energy barrier at the heterojunction interface, and therefore the electron blocking effect can be reliably prevented. Accordingly, current gain is increased and thus transistor properties can be improved, resulting in a highly effective DHBT suitable for high-speed operation.

Furthermore, in this embodiment, the setback layer 104 is provided between the base layer 105 and the collector layer 103. Thus, the electron blocking effect can be reliably prevented.

Furthermore, in this embodiment, the electron blocking effect is prevented using the delta doped layer 112. Thus, the capacitance between the base layer 105 and the collector layer 103 can be reduced, compared to the case in which the electron blocking effect is prevented by continuously changing the impurity concentration of the collector layer 103. Moreover, the delta doped layer 112 is formed, when the collector layer 103 is epitaxially grown, by stopping the epitaxial growth and then introducing into the collector layer 103 an impurity at about an amount required to form a single atomic layer. Thus, the amount of an impurity to be added into the collector layer 103 can be accurately controlled with high reproducibility and without depending on epitaxial growth conditions. Thus, stable transistor properties can be achieved.

Note that in this embodiment, a process step for forming the delta doped layer 112 and a region of the collector layer 103 in which the delta doped layer 112 is formed are not particularly limited as long as the thickness of an energy barrier at the heterojunction interface can be reduced by providing a delta doped layer 112. However, the delta doped layer 112 forming region is preferably a region of the collector layer 103 located at about 10 nm or less from the heterojunction interface with the setback layer 104, although it may vary within a negligibly small range according to a semiconductor material for the collector layer 103 or the setback layer 104, or the impurity concentration in the collector layer 103 or the like. Thus, the thickness of the energy barrier at the heterojunction interface can be reduced to a level that allows tunneling of electrons. In this case, the number of the delta doped layer 112 is not particularly limited. If a delta doped layer is provided in a region of the collector layer 103 located at about 20 nm or more from the heterojunction interface with the setback layer 104, the distance between the heterojunction interface and the delta doped layer is greater than about a wavelength of an electric wave. Therefore, in such a case, the thickness of the energy barrier at the heterojunction interface can not be reduced and thus almost no effect of facilitating tunneling of electrons can be achieved.

Furthermore, in this embodiment, the delta doped layer 112 is provided in a region of the collector layer 103 located in the vicinity of the heterojunction interface with the setback layer 104. However, the delta doped layer 112 may be provided at the heterojunction interface itself between the collector layer 103 and the setback layer 104 instead. Thus, compared to the case where only the setback layer 104 is provided, the height of an energy barrier to be formed at the heterojunction interface is further reduced and thus electrons can easily go over the energy barrier.

Furthermore, in this embodiment, the setback layer 104 is provided between the base layer 105 and the collector layer 103. However, without providing the setback layer 104, a direct heterojunction may be formed between the base layer 105 and the collector layer 103 instead. In such a case, the delta doped layer 112 forming region is preferably provided in a region of the collector layer 103 located at about 10 nm or less from the heterojunction interface with the base layer 105, or at the heterojunction interface itself between the collector layer 103 and the base layer 105.

Furthermore, in this embodiment, the same material as that for the base layer 105, i.e., GaAs is used as a material for the setback layer 104. However, a material for the setback layer 104 is not particularly limited as long as it has a narrower bandgap than that of a material for the collector layer 103. Moreover, the setback layer 104 may be an undoped layer or an n-type layer.

Furthermore, in this embodiment, InGaP is used as a material for the collector layer 103 and the emitter layer 106 and GaAs is used as a material for the base layer 105. In other words, the InGaP/GaAs/InGaP structure is used as a DHBT structure. However, the structure of a DHBT is not particularly limited as long as the bandgaps of a collector layer and an emitter layer are wider than that of a base layer. For example, the InP/InGaAs/InP structure or like structures may be used.

Furthermore, in this embodiment, a single layer structure of an InGaP layer is used for the collector layer 103. However, a single layer structure of, i.e., an InP layer or a GaAs layer, a multilayer structure including at least two of an InGaP layer, an InP layer and a GaAs layer, or the like may be used instead. For example, when an GaAs layer is formed as the collector layer 103 by MOCVD, TMG and $AsH_3$ (arsine) may be used as source gases of a Group III element and a Group V element, respectively. Moreover, when, for example, an InP layer is formed as the collector layer 103 by MOCVD, TMI and $PH_3$ may be used as source gases of a Group III and a Group V element, respectively.

What is claimed is:

1. A compound semiconductor device comprising:

an emitter layer;

a base layer which is in contact with the emitter layer and formed of a first compound semiconductor; and a collector layer which is in contact with the base layer and formed of a second compound semiconductor having a wider bandgap than that of the first compound semiconductor, wherein the device further includes a setback layer provided between the collector layer and the base layer and formed of a third compound semiconductor having a narrower bandgap than that of the second compound semiconductor, and wherein a delta doped layer having a higher concentration of an impurity than that of the collector layer is formed in a region of the collector layer located at about 10 nm or less from the heterojunction interface with the setback layer.

2. The compound semiconductor device, wherein the collector layer includes a semiconductor formed of InGaP, InP or GaAs.

3. A method for fabricating a compound semiconductor device, which is a method for fabricating the compound semiconductor device of claim 1, comprising the step of forming the delta dope layer, while epitaxially growing a semiconductor layer that is to be the collector layer, by stopping the epitaxial growth and then introducing into the semiconductor layer an amount of impurity at least required to form a single atomic layer.

* * * * *